(12) United States Patent
Marin et al.

(10) Patent No.: US 10,180,452 B2
(45) Date of Patent: Jan. 15, 2019

(54) DOORBELL CAMERA TEST TOOL

(71) Applicant: Nortek Security & Control LLC, Carlsbad, CA (US)

(72) Inventors: Ernesto Alonzo Marin, Oceanside, CA (US); Angel De La Rosa, San Diego, CA (US)

(73) Assignee: Nortek Security & Control LLC, Carlsbad, CA (US)

( * ) Notice: Subject to any disclaimer, the term of this patent is extended or adjusted under 35 U.S.C. 154(b) by 0 days.

(21) Appl. No.: 15/382,014

(22) Filed: Dec. 16, 2016

(65) Prior Publication Data

US 2018/0172755 A1 Jun. 21, 2018

(51) Int. Cl.
*G01R 31/00* (2006.01)
*G01R 31/28* (2006.01)
*H04N 7/18* (2006.01)
*G01R 31/26* (2014.01)
*G01R 31/02* (2006.01)

(52) U.S. Cl.
CPC ....... *G01R 31/2825* (2013.01); *G01R 31/027* (2013.01); *G01R 31/2632* (2013.01); *H04N 7/186* (2013.01)

(58) Field of Classification Search
CPC .............. G01R 31/2825; G01R 31/027; G01R 31/2632; H04N 7/186
See application file for complete search history.

(56) References Cited

U.S. PATENT DOCUMENTS

| 3,982,237 A * | 9/1976 | Conville | G08B 17/107 340/507 |
| 5,669,987 A * | 9/1997 | Takehara | H02S 50/10 136/244 |
| 6,512,458 B1 * | 1/2003 | Kobayashi | H02S 50/10 340/507 |
| 2005/0007451 A1 * | 1/2005 | Chiang | G08B 13/19634 348/143 |

* cited by examiner

*Primary Examiner* — Julian D Huffman
*Assistant Examiner* — Michael T Konczal
(74) *Attorney, Agent, or Firm* — Schwegman Lundberg & Woessner, P.A.

(57) ABSTRACT

A test tool for a low voltage devices is described. The test tool comprises a voltage sensor, a current sensor, a diode sensor, a testing module, and an indicator. The voltage sensor determines a voltage between a first and second electrical wire from an alternating current (AC) transformer. The current sensor determines a current between the first and second electrical wires. The diode sensor determines a presence of a diode connected to the first and second electrical wires based on the current and the voltage. The testing module identifies one or more installation diagnostics related to a device to be coupled with the AC transformer. The indicator generates a visual or audible indicator corresponding to the one or more installation diagnostics.

16 Claims, 8 Drawing Sheets

DOORBELL CAMERA TEST TOOL

TECHNICAL FIELD

This application relates generally to a testing tool for a device, and, in a specific example embodiment, a testing tool for low voltage devices.

BACKGROUND

Household doorbells are typically connected to an AC transformer that converts high voltage AC current (e.g., 120 Volts) to low voltage AC current (e.g., 12 Volts). Some low voltage devices such as doorbell cameras may require a voltage or current that is not supported by legacy transformers in older households. For example, a user may install and connect a new doorbell camera to an existing transformer only to realize afterward that the new doorbell camera is inoperable and not supported by the existing transformer. Therefore, testing and diagnostic of the new doorbell camera after its installation forces the user to unmount and uninstall the doorbell camera, replace the transformer, and reinstall the new doorbell camera.

BRIEF DESCRIPTION OF THE DRAWINGS

The present embodiments, are illustrated by way of example, and not by way of limitation, in the figures of the accompanying drawings in which.

DETAILED DESCRIPTION

Although the present disclosure has been described with reference to specific example embodiments, it will be evident that various modifications and changes may be made to these embodiments without departing from the broader spirit and scope of the disclosure. Accordingly, the specification and drawings are to be regarded in an illustrative rather than a restrictive sense.

A test tool to help diagnose installation requirements for a low voltage device such as a doorbell camera is described. The test tool has two contacts to connect to a wiring of the doorbell camera. The test tool includes a circuit that detects AC Voltage and AC Current to determine whether the doorbell camera can be installed successfully. The test tool tests for low and high voltage and indicates, for example, by an LED light or multiple such lights, that the voltage is appropriate fur the doorbell camera. The test tool can also test for the presence of a diode from the AC circuit. If a diode is not present, the LED light(s) will indicate it that a diode is to be installed. The test tool can also test for reversed wiring. For example, if the wires need to be reversed, then this is indicated by an LED light or a combination of multiple lights. If the voltage, the diode, and the wiring are correct, then the test tool indicates this using an LED light or multiple lights.

One advantage of using the presently described test tool to diagnose the installation location is to ensure that the doorbell camera will operate properly prior to installing and mounting the doorbell camera. This helps reduce installation time by confirming that the doorbell transformer, the door chime, and diode has been installed properly and meet the operating requirements of the doorbell camera prior to beginning the installation of the doorbell camera. Without the test tool, diagnosing a malfunction of the doorbell camera after its installation may require more time since the installer would have to uninstall and unmount the doorbell camera. Some doorbell transformers may be too old or rusted or otherwise degraded in some manner. The present test tool notifies the installer, for example, that the transformer needs to be replaced prior to completing the installation of the doorbell camera.

In various embodiments, a test tool for a low voltage device is described. The test tool comprises a voltage sensor, a current sensor, a diode sensor, a testing module, and an indicator. The voltage sensor determines a voltage between a first and a second electrical wire from an alternating current (AC) transformer. The current sensor determines a current between the first electrical wire and the second electrical wire. The diode sensor determines the presence or absence of a diode connected to the first and second electrical wires based on the current. The testing module identifies installation diagnostics related to a device to be coupled with the AC transformer. The indicator generates a visual or audible indication corresponding to the installation diagnostics.

In another example embodiment, the operating parameters comprise voltage operating parameters, current operating parameters, and diode operating parameters. The installation diagnostics include a first diagnostic indicating that the AC transformer meets the operating parameters of the device, a second diagnostic indicating that the first electrical and second electrical wires are improperly connected to the test tool and to reverse a connection of the first electrical and second electrical wires to the test tool, a third diagnostic indicating that the AC transformer does not meet the operating parameters of the device, and a fourth diagnostic indicating that the diode is missing.

In another example embodiment, the testing module is configured to identify whether the voltage from the AC transformer meets the voltage operating parameters of the device, whether the current from the AC transformer meets the current operating parameters of the device, and whether the first electrical and second electrical wires meet the diode operating parameters of the device.

In another example embodiment, the visual or audible indicator includes a first indicator corresponding to the first diagnostic, a second indicator corresponding to the second diagnostic, a third indicator corresponding to the third diagnostic, and a fourth indicator corresponding to the fourth diagnostic.

In another example embodiment, the device includes a low voltage device. The low voltage device includes, for example, a doorbell camera.

In another example embodiment, the test tool identifies the device to be coupled to the AC transformer, and retrieves operating parameters of the identified device.

In another example embodiment, a reference module receives, at the test tool, a user input identifying the device. The reference module identifies the device based on a combination of a geographic location of the test tool and an identity of a technician at the geographic location. The reference module identifies the device to be coupled to the AC transformer, queries a server for operating parameters of the identified device, and receives the operating parameters of the identified device from the server.

Figure 1A:
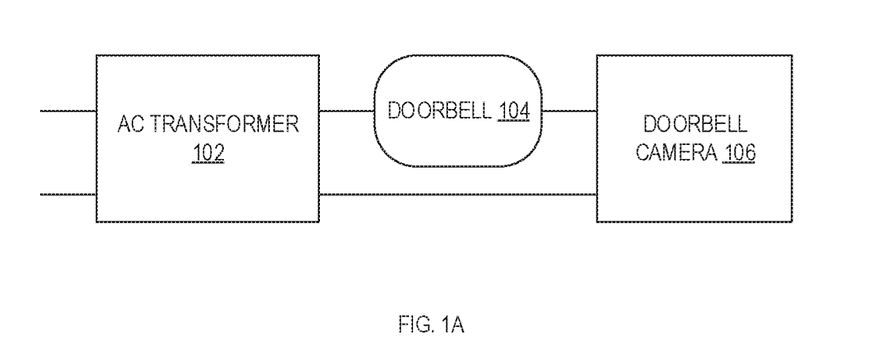
FIG. 1A is a wiring diagram illustrating an example embodiment of a doorbell camera circuit.

FIG. 1A is a wiring diagram illustrating a doorbell camera circuit in a typical household. An alternating current (AC) transformer 102 is connected to a doorbell 104 (e.g., a chime). A low voltage device such as a doorbell camera 106 is added to the circuit. However, the doorbell camera 106 may not operate properly if the voltage or current from the AC transformer 102 does not meet the operating requirements of the doorbell camera 106.

Figure 1B:
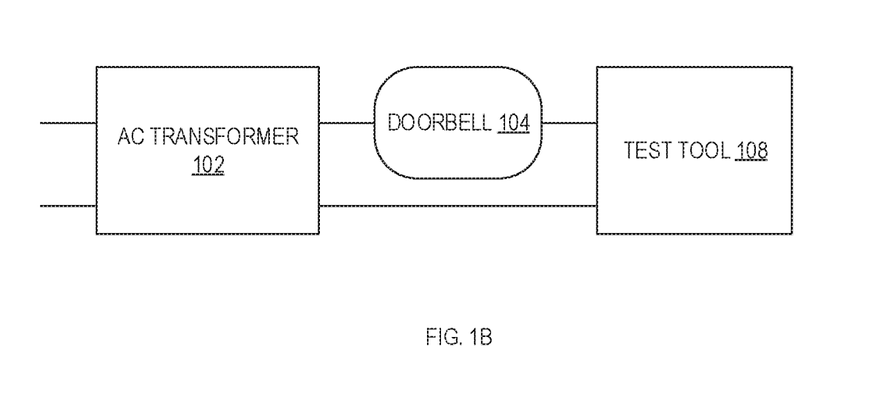
FIG. 1B is a wiring diagram illustrating an example embodiment of a test tool.

FIG. 1B is a wiring diagram illustrating an example embodiment of a test tool 108. Prior to installation of the doorbell camera 106, the test tool 108 can be connected to the circuit to determine whether the AC transformer 102 meets the operating requirement of the doorbell camera 106.

Figure 2:
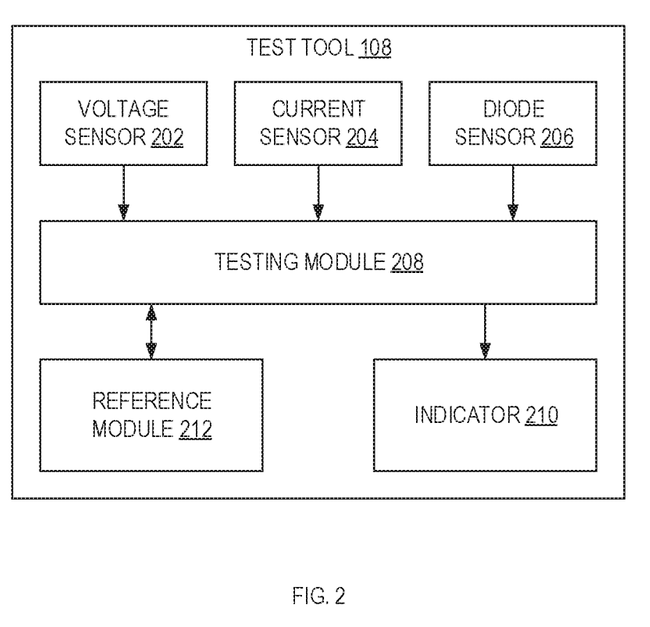
FIG. 2 is a block diagram illustrating an example embodiment of a test tool.

FIG. 2 is a block diagram illustrating an example embodiment of the test tool 108. The test tool 108 includes a voltage sensor 202, a current sensor 204, a diode sensor 206, a testing module 208, a reference module 212, and an indicator module 210. The test tool 108 may be connected or coupled to the circuit described in FIG. 1B. For example, the test tool 108 includes two wires. One wire is connected to the wire from the doorbell 104 while the other wire is connected to the AC transformer 102 to form a new circuit. The voltage sensor 202 measures the voltage from the new circuit. The current sensor 204 measures the current from the new circuit. The diode sensor 206 determines whether a diode is present in the new circuit.

The testing module 208 compares the voltage, current, and other sensor data, such as the presence or absence of a diode, with the operating parameters of the test tool 108. For example, the testing module 208 determines voltages from the new circuit as measured by the voltage sensor 202 and compares the measured voltages with the voltage requirement of the device (e.g., doorbell camera 106). The operating requirements include, for example, minimum and maximum voltages, minimum and maximum currents, and diode requirement (e.g., whether a diode is required and missing from the circuit). The testing module 208 can then determine whether the device can operate in the circuit formed with the AC transformer 102. Furthermore, the testing module 208 generates installation diagnostics based on the comparison.

The indicator 210 generates a visual or audio indication based on the installation diagnostics generated by the testing module 208. For example, the indicator 210 includes LED lights that generate different colors based on the installation diagnostics. A green light may indicate that the device can properly operate with the AC transformer 102. A red light may indicate that the wires are crossed and should be reversed. A blue light may indicate that the AC transformer 102 cannot operate with the device and should be replaced. An orange light may indicate that a diode is missing from the circuit and should be installed.

In other examples, the indicator 210 may include a speaker or audio indicator that generates audio-based installation diagnostics. For example, the test tool 108 may generate different tones based on the installation diagnostics. Indicator 210 and other indicators in examples according to this disclosure can include other types of indicators or output can be used to communicate the installation diagnostics to the installer, whether it be audio or visual.

The reference module 212 may store the operating requirements of different low voltage devices (e.g., doorbell camera 106). For example, the reference module 212 includes a database of minimum and maximum voltages, minimum and maximum currents, and diode requirements of corresponding low voltage devices. In other embodiments, the reference module 212 includes a communication device that enables the reference module 212 to communicate with a computer network to retrieve operating requirements of low voltage devices from a remote server. Examples of communications include wireless communication such as Wi-Fi, Bluetooth, Z-Wave, ZigBee, or wired communication using, for example, an Ethernet or USB cable.

Figure 3:
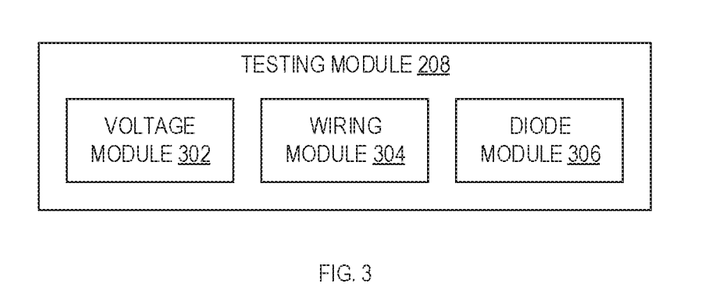
FIG. 3 is a block diagram illustrating an example embodiment of a testing module of the test tool of FIG. 2.

FIG. 3 is a block diagram illustrating an example embodiment of a testing module 208 of the test tool 108 of FIG. 2. The testing module 208 includes a voltage module 302, a wiring module 304, and a diode module 306. The voltage module 302 determines the voltage of the circuit using the voltage sensor 202. The wiring module 304 determines the current of the circuit using the current sensor 204. The diode module 306 determines the presence or absence of a diode in the circuit using the diode sensor 206. The testing module 208 compares the voltage, current, and the presence or absence of a diode with the operating requirements of the low voltage device to determine whether the AC transformer 102 can operate properly with the low voltage device.

Figure 4:
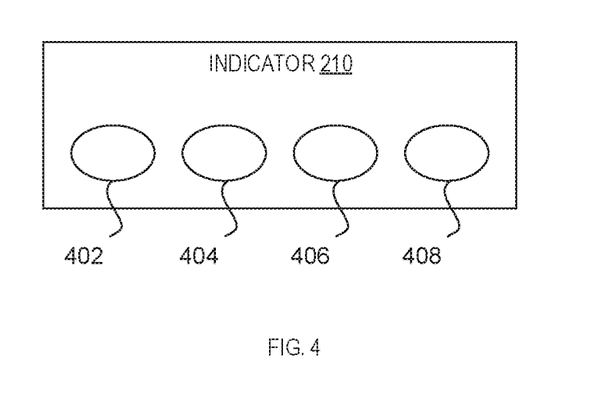
FIG. 4 is a block diagram illustrating an example of visual indicators.

FIG. 4 is a block diagram illustrating an example of visual indicators. The indicator 210 includes a first LED 402, a second LED 404, a third LED 406, and a fourth LED 408. The first LED 402 may indicate that the device can properly operate with the AC transformer 102. The second LED 404 may indicate that the wires are crossed and should be reversed. The third LED 406 may indicate that the AC transformer 102 cannot operate with the device and should be replaced. The fourth LED 408 may indicate that a diode is missing from the circuit and should be installed. Additional examples include more or fewer visual indicators (for example, LEDs), different types of visual indicators (for example, other than LEDs), and different indications associated with the indicators.

Figure 5:
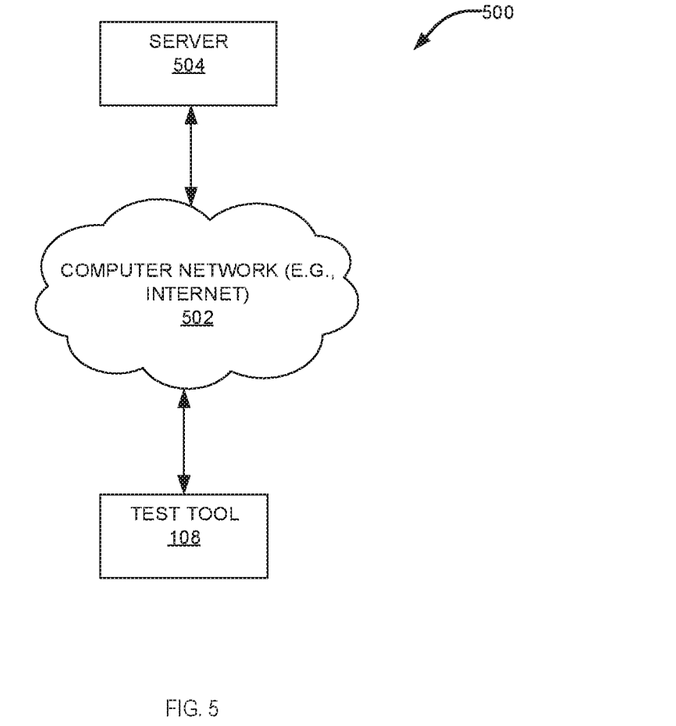
FIG. 5 is a block diagram illustrating an example embodiment of a network system for implementing the test tool.

FIG. 5 is a block diagram illustrating an example embodiment of a network system for implementing the test tool 108. As previously described, the test tool 108 is capable of communicating with a server 504 via a computer network 502. The test tool 108 may communicate an identity of a low voltage device to be installed and retrieve operating requirements corresponding to the low voltage device from the server 504.

The test tool 108 and the server 504 are connected to the computer network 502. The test tool 108 and the server 504 each include a network interface that enables them to send and receive data to and from the computer network 502. The test tool 108 may communicate indirectly via a cellular tower signal, directly via a Wi-Fi signal, or via other means, to the network 502.

The computer network 502 can include a local area network (LAN) where gigabit ethernet switches are used to switch data. In another example, the computer network 502 includes a wide area network, such as the Internet. In general, computer network 502 may be a public network or private network, a single network or a combination of several networks. In most embodiments, computer network 502 may be, but is not required to be, an IP-based network. In some embodiments it may be desirable for all or a portion of network 502 to include publicly available networks, such as the Internet, to avoid the need for installing, purchasing, or leasing additional infrastructure.

The server 504 may also connect to the computer network 502 both to receive and transmit data. The server 504 may also be referred to as a web-based host. The server 504 is connected to the computer network 502 by means of a network interface. The network interface can take the form of a network interface card (not shown) installed within the server 504 to enable data to sent and received to and from the computer network 502 by the server 504.

Figure 6:
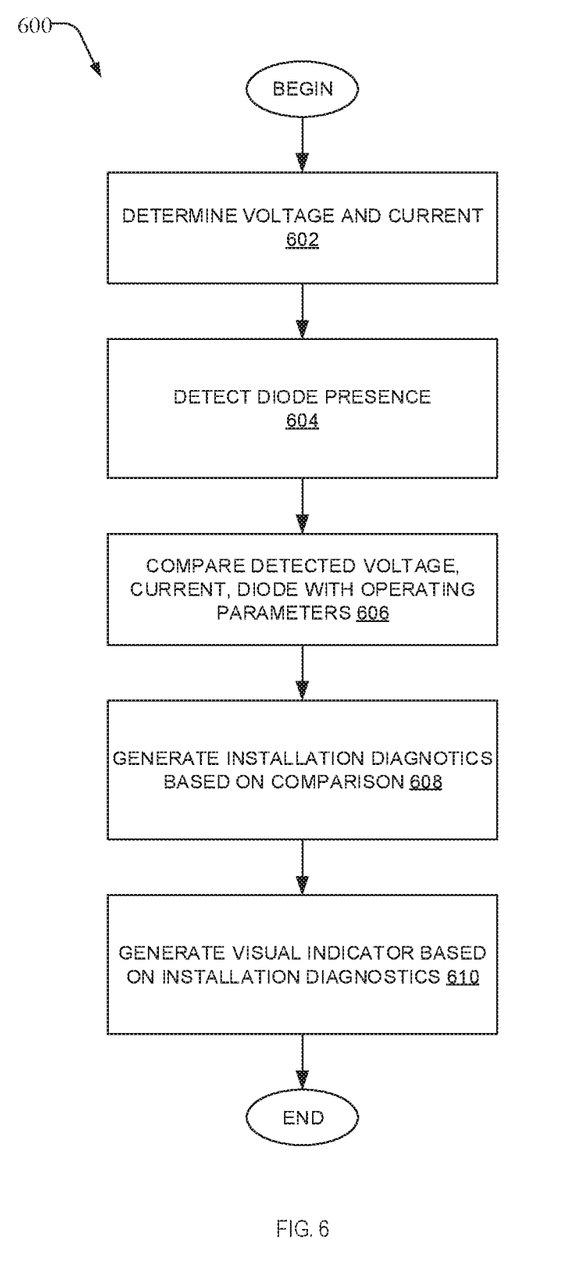
FIG. 6 is a flow diagram illustrating an example embodiment of a method of an operation of the test tool.

FIG. 6 is a flow diagram illustrating an example embodiment of a method 600 of an operation of the test tool 108. At operation 602, the test tool 108 determines the voltage and current from the AC transformer 102. Operation 602 may be implemented, for example, with the voltage sensor 202 and the current sensor 204. At operation 604, the test tool 108 detects whether a diode is present in the circuit. Operation 604 may be implemented, for example, with the diode sensor 206. At operation 606, the test tool 108 compares the detected voltage, current, diode presence (or absence) with the operating parameters corresponding to the low voltage device (e.g., doorbell camera 106). Operation 606 may be implemented, for example, with the testing module 208. At operation 608, the test tool 108 generates an installation diagnostic based on the comparison. Operation 608 may be implemented, for example, with the testing module 208. At operation 610, the test tool 108 generates a visual indicator corresponding to the installation diagnostic. Operation 610 may be implemented, for example, with the indicator 210.

Figure 7:
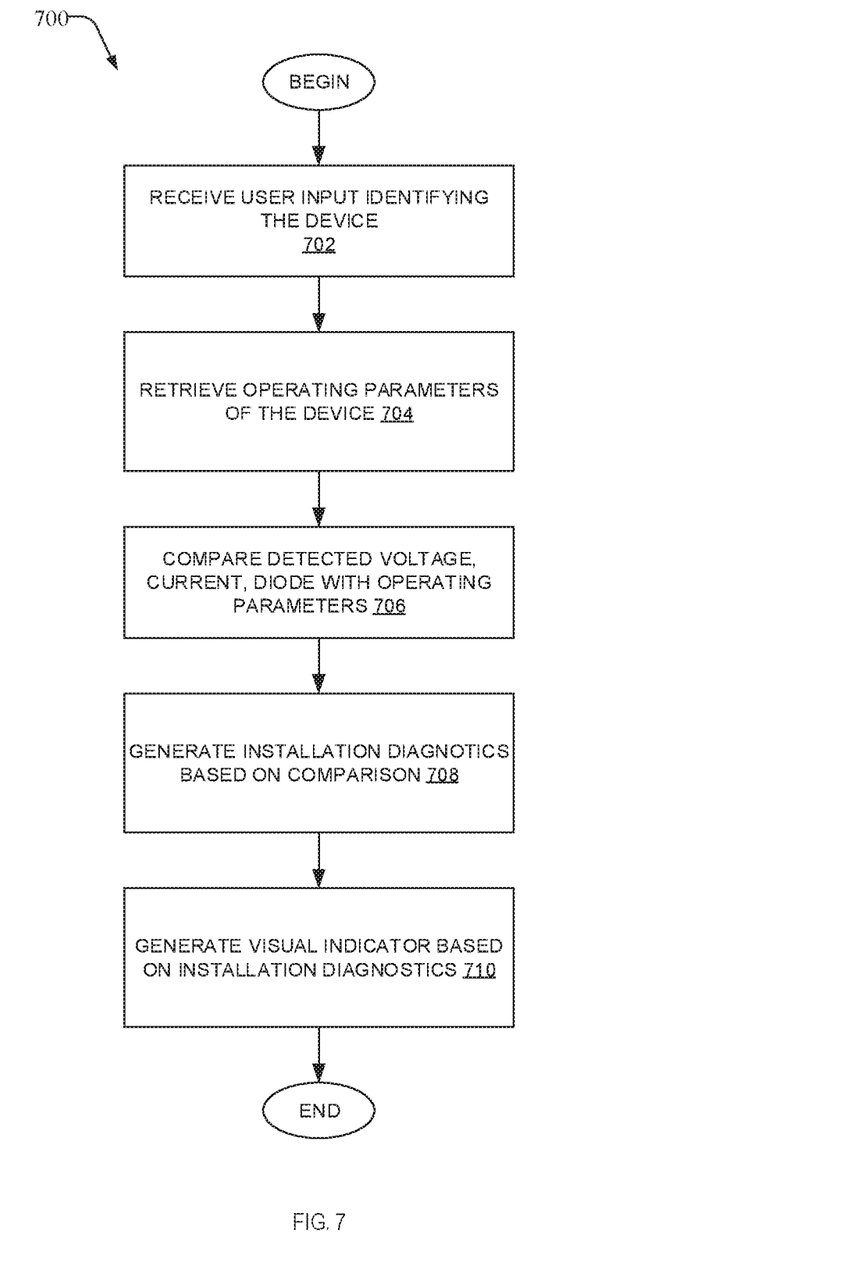
FIG. 7 is a flow diagram illustrating another example embodiment of a method of an operation of the test tool.

FIG. 7 is a flow diagram illustrating another example embodiment of a method 700 of an operation of the test tool 108. At operation 702, the test tool 108 receives a user input identifying the low voltage device. For example, the installer may enter, via a keypad or other user interface means, the model of the low voltage device. In another example embodiment, the test tool 108 includes a bar code scanner that scans for a visual identifier such as a bar code on the low voltage device to identify the low voltage device. At operation 704, the test tool 108 retrieves operating parameters of the low voltage device based on the user input (e.g., bar code, QR code, or any unique identifier associated with the low voltage device). At operation 706, the test tool 108 compares the detected voltage, current, and diode presence (or absence) with the retrieved operating parameters corresponding to the identified low voltage device (e.g., doorbell camera 106). Operation 706 may be implemented, for example, with the testing module 208. At operation 708, the test tool 108 generates an installation diagnostic based on the comparison. Operation 708 may be implemented, for example, with the testing module 208. At operation 710, the test tool 108 generates a visual indicator corresponding to the installation diagnostic. Operation 710 may be implemented, for example, with the indicator 210.

Figure 8:
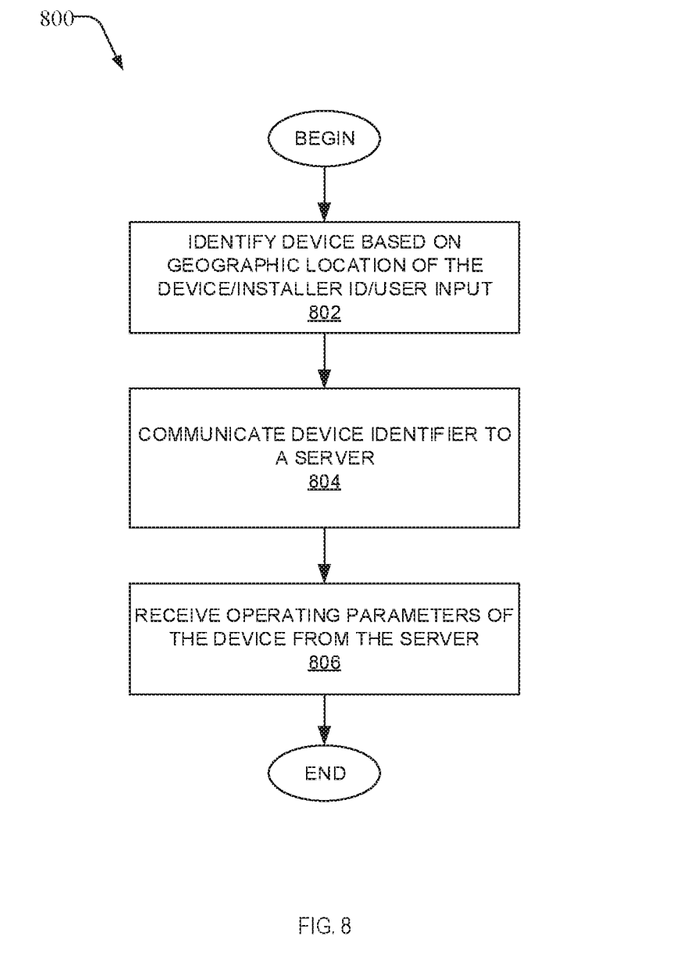
FIG. 8 is a flow diagram illustrating another example embodiment of a method of an operation of the test tool.

FIG. 8 is a flow diagram illustrating another example embodiment of a method 800 of an operation of the test tool 108. At operation 802, the test tool 108 identifies a low voltage device based on a combination of the geographic location of the test tool 108, the installer ID, and the user input. At operation 804, the test tool 108 communicates the low voltage device identifier to the server 504. In another example embodiment, the test tool 108 communicates the geographic location of the test tool 108, the installer ID, or the user input to the server 504. The server 504 then identifies the low voltage device based on the geographic location of the test tool 108, the installer ID, or the user input. At operation 806, the test tool 108 receives operating parameters of the identified low voltage device from the server 504.

Modules, Components and Logic

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client, or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired) or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses that connect the hardware modules). In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via the network 502 and via one or more appropriate interfaces (e.g., APIs).

Electronic Apparatus and System

Example embodiments may be implemented in digital electronic circuitry, or in computer hardware, firmware, software, or in combinations of them. Example embodiments may be implemented using a computer program product, e.g., a computer program tangibly embodied in an information carrier, e.g., in a machine-readable medium for execution by, or to control the operation of, data processing apparatus, e.g., a programmable processor, a computer, or multiple computers.

A computer program can be written in any form of programming language, including compiled or interpreted languages, and it can be deployed in any form, including as a stand-alone program or as a module, subroutine, or other unit suitable for use in a computing environment. A computer program can be deployed to be executed on one computer or on multiple computers at one site or distributed across multiple sites and interconnected by a communication network 502.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., a FPGA or an ASIC).

A computing system can include clients and servers 504. A client and server 504 are generally remote from each other and typically interact through a communication network 502. The relationship of client and server 504 arises by virtue of computer programs running on the respective computers and having a client-server relationship to each other. In embodiments deploying a programmable computing system, it will be appreciated that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor), or a combination of permanently and temporarily configured hardware may be a design choice. Below are set out hardware (e.g., machine) and software architectures that may be deployed, in various example embodiments.

Example Machine Architecture and Machine-Readable Medium

Figure 9:
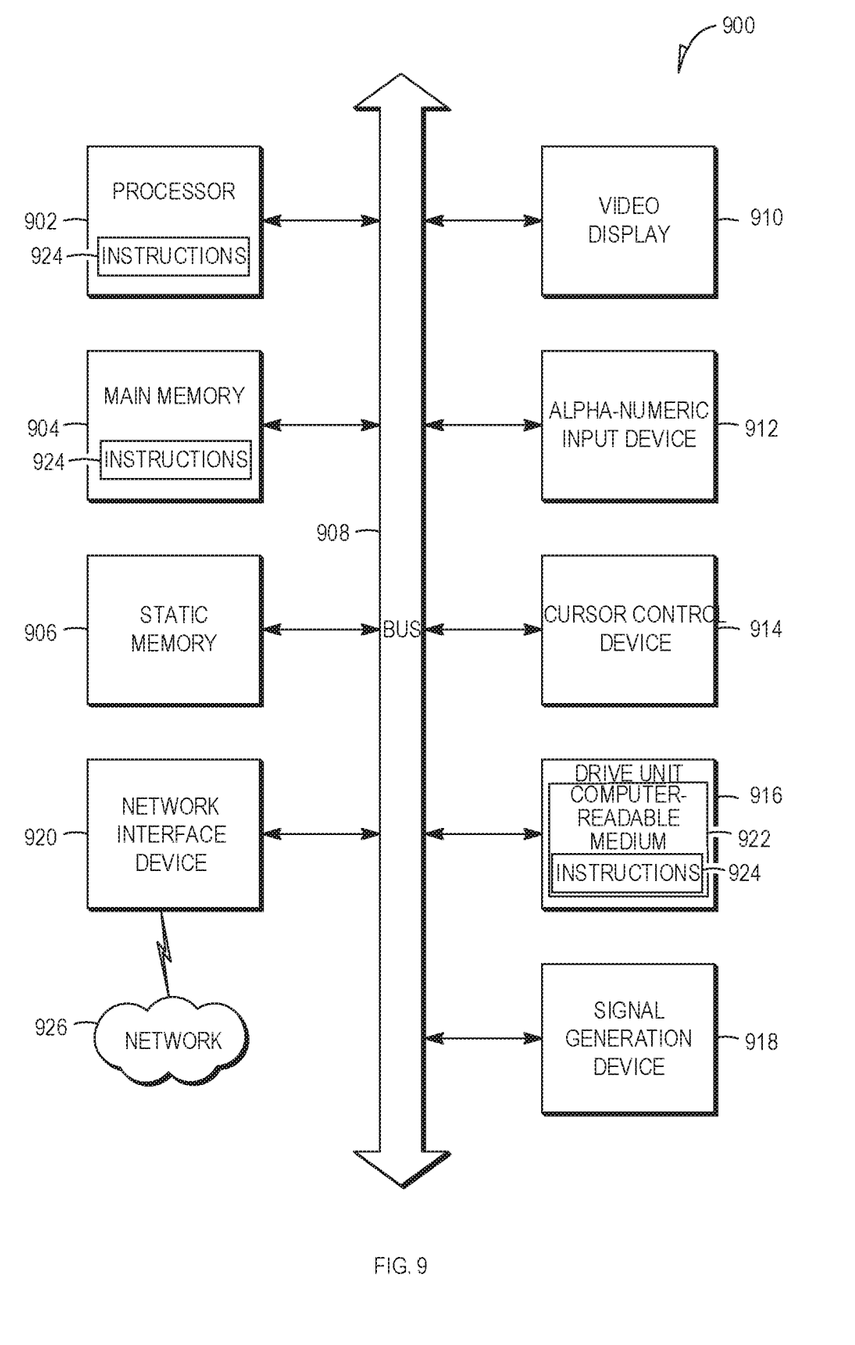
FIG. 9 shows a diagrammatic representation of machine in the example form of a computer system within which a set of instructions may be executed to cause the machine to perform any one or more of the methodologies discussed herein.

FIG. 9 is a block diagram of a machine in the example form of a computer system 900 within which instructions 924 for causing the machine to perform any one or more of the methodologies discussed herein may be executed. In alternative embodiments, the machine operates as a stand-alone device or may be connected (e.g., networked) to other machines. In a networked deployment, the machine may operate in the capacity of a server 504 or a client machine in a server-client network environment, or as a peer machine in a peer-to-peer (or distributed) network environment. The machine may be a personal computer (PC), a tablet a set-top box (SIB), a personal digital assistant (PDA), a cellular telephone, a web appliance, a network router, switch or bridge, or any machine capable of executing instructions 924 (sequential or otherwise) that specify actions to be taken by that machine. Further, while only a single machine is illustrated, the term "machine" shall also be taken to include any collection of machines that individually or jointly execute a set (or multiple sets) of instructions 924 to perform any one or more of the methodologies discussed herein.

The example computer system 900 includes a processor 902 (e.g., a central processing unit (CPU), a graphics processing unit (GPU) or both), a main memory 904 and a static memory 906, which communicate with each other via a bus 908. The computer system 900 may further include a video display unit 910 (e.g., a liquid crystal display (LCD) or a cathode ray tube (CRT)). The computer system 900 also includes an alphanumeric input device 912 (e.g., a keyboard), a user interface (UI) navigation (or cursor control) device 914 (e.g., a mouse), a disk drive unit 916, a signal generation device 918 (e.g., a speaker) and a network interface device 920.

Machine-Readable Medium

The disk drive unit 916 includes a computer-readable medium 922 on which is stored one or more sets of data structures and instructions 924 (e.g., software) embodying or utilized by any one or more of the methodologies or functions described herein. The instructions 924 may also reside, completely or at least partially, within the main memory 904 and/or within the processor 902 during execution thereof by the computer system 900, the main memory 904 and the processor 902 also constituting computer-readable media 922. The instructions 924 may also reside, completely or at least partially, within the static memory 906.

While the computer-readable medium 922 is shown, in an example embodiment, to be a single medium, the term "machine-readable medium" may include a single medium or multiple media (e.g., a centralized or distributed database, and/or associated caches and servers 504) that store the one or more instructions 924 or data structures. The term "computer-readable medium" shall also be taken to include any tangible medium that is capable of storing, encoding or carrying instructions 924 for execution by the machine and that cause the machine to perform any one or more of the methodologies of the present embodiments, or that is capable of storing, encoding or carrying data structures utilized by or associated with such instructions 924. The term "computer-readable medium" shall accordingly be taken to include, but not be limited to, solid-state memories, and optical and magnetic media. Specific examples of computer-readable media 922 include non-volatile memory, including by way of example semiconductor memory devices (e.g., erasable programmable read-only memory (EPROM), electrically erasable programmable read-only memory (EEPROM), and flash memory devices); magnetic disks such as internal hard disks and removable disks; magneto-optical disks; and compact disc-read-only memory (CD-ROM) and digital versatile disc (or digital video disc) read-only memory (DVD-ROM) disks.

Transmission Medium

The instructions 924 may further be transmitted or received over a communications network 926 using a transmission medium. The instructions 924 may be transmitted using the network interface device 920 and any one of a number of well-known transfer protocols (e.g., HTTP). Examples of communication networks 926 include a LAN, a WAN, the Internet, mobile telephone networks, POTS networks, and wireless data networks (e.g., Wi-Fi and WiMAX networks). The term "transmission medium" shall be taken to include any intangible medium capable of storing, encoding, or carrying instructions 924 for execution by the machine, and includes digital or analog communications signals or other intangible media to facilitate communication of such software.

Although an embodiment has been described with reference to specific example embodiments, it will be evident that various modifications and changes may be made to these embodiments without departing from the scope of the present disclosure. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

The following enumerated embodiments describe various example embodiments of a test tool 108 discussed herein.

A first embodiment provides a test tool 108 comprising:
  a voltage sensor 202 configured to determine a voltage between a first and a second electrical wire from an alternating current (AC) transformer 102;
  a current sensor 204 configured to determine a current between the first electrical wire and the second electrical wire;
  a diode sensor 206 configured to determine a presence of a diode connected to the first and second electrical wire based on the current and voltage;
  a testing module 208 connected to the voltage sensor 202, the current sensor 204, and the diode sensor 206, the testing module 208 configured to identify installation diagnostics related to a device to be coupled with the AC transformer 102 based on the voltage, current, the presence of the diode, and operating parameters of the device; and
  an indicator 210 configured to generate a visual or audible indication corresponding to the installation diagnostics.

A second embodiment provides a device according to the first embodiment, wherein the operating parameters comprise voltage operating parameters, current operating parameters, and diode operating parameters,
  wherein the installation diagnostics include a first diagnostic indicating that the AC transformer 102 meets the operating parameters of the device, a second diagnostic indicating that the first electrical and second electrical wires are improperly connected to the test tool 108 and to reverse a connection of the first electrical and second electrical wires to the test tool 108, a third diagnostic indicating that the AC transformer 102 does not meet the operating parameters of the device, and a fourth diagnostic indicating that the diode is missing.

A third embodiment provides a device according to the second embodiment, wherein the testing module 208 is configured to identify whether the voltage from the AC transformer 102 meets the voltage operating parameters of the device, whether the current from AC transformer 102 meets the current operating parameter of the device, and whether the first electrical and second electrical wires meet the diode operating parameters of the device.

A fourth embodiment provides a device according to the first embodiment, wherein the visual or audible indicator 210 comprises:
  a first indicator 210 corresponding to the first diagnostic;
  a second indicator 210 corresponding to the second diagnostic;

a third indicator 210 corresponding to the third diagnostic; and a fourth indicator 210 corresponding to the fourth diagnostic.

A fifth embodiment provides a device according to the first embodiment, wherein the device includes a low voltage device.

A sixth embodiment provides a device according to the fifth embodiment, wherein the low voltage device includes a doorbell camera 106.

A seventh embodiment provides a device according to the first embodiment, further comprising:
a reference module 212 configured to identify the device to be coupled to the AC transformer 102, and to retrieve operating parameters of the identified device.

An eighth embodiment provides a device according to the seventh embodiment, wherein the reference module 212 is configured to receive, at the test tool 102, a user input identifying the device.

A ninth embodiment provides a device according to the eighth embodiment, wherein the reference module 212 is configured to identify the device based a combination of a geographic location of the test tool 102 and an identity of a technician at the geographic location.

A tenth embodiment provides a device according to the first embodiment, further comprising:
a reference module 212 configured to identify the device to be coupled to the AC transformer 102, to query a server 504 for operating parameters of the identified device, and to receive the operating parameters of the identified device from the server 504.

What is claimed is:

1. A test tool comprising:
a voltage sensor configured to measure a voltage between a first and a second electrical wire from a circuit formed with an alternating current (AC) transformer, a doorbell, and the test tool, the first electrical wire being connected to the AC transformer, the second electrical wire being connected to the doorbell;
a current sensor configured to measure a current between the first and second electrical wires;
a testing component connected to the voltage sensor, the current sensor, the testing component configured to determine whether the circuit includes a diode based on the measured voltage and measure current, determine whether a doorbell camera can operate with the AC transformer and the doorbell based on the measured voltage, measured current, whether the circuit includes the diode, and one or more operating parameters of the doorbell camera; and
an indicator configured to generate a visual or audible signal based on whether the doorbell camera can operate with the AC transformer and the doorbell.

2. The test tool of claim 1, wherein the testing circuit is configured to determine whether the AC transformer meets the operating parameters of the doorbell camera, whether the first electrical and second electrical wires are improperly connected to the test tool whether the AC transformer does not meet the operating parameters of the device, and whether the diode is missing from the circuit.

3. The test tool of claim 2, wherein the testing circuit is configured to determine whether the voltage from the AC transformer meets the voltage operating parameters of the doorbell camera, and whether the current from the AC transformer meets the current operating parameter of the doorbell camera.

4. The test tool claim 2, wherein the indicator comprises:
a first indicator indicating that the voltage or current from the AC transformer meets the operating parameters of the doorbell camera;
a second indicator indicating that the first electrical and second electrical wires are improperly connected to the test tool;
a third indicator corresponding to the third diagnostic indicating that the voltage or current from the AC transformer does not meet the operating parameters of the doorbell camera; and
a fourth indicator corresponding to the fourth diagnostic indicating that the diode is missing from the circuit.

5. The test tool of claim 1, further comprising:
a reference module configured to identify the doorbell camera to be coupled to the AC transformer, and to retrieve the one or more operating parameters of the identified doorbell camera.

6. The test tool of claim 5, wherein the reference module is configured to receive, at the test tool, a user input identifying the doorbell camera.

7. The test tool of claim 6, wherein the reference module is configured to identify the doorbell camera based a combination of a geographic location of the test tool and an identity of a technician at the geographic location.

8. The test tool of claim 1, further comprising:
a reference module configured to identify the doorbell camera to be coupled to the AC transformer, to query a server for one or more operating parameters of the identified doorbell camera, and to receive the one or more operating parameters of the identified doorbell camera from the server.

9. A method comprising:
measuring, using a voltage sensor, a voltage between a first and a second electrical wire from a circuit formed with an alternating current (AC) transformer, a doorbell, and the test tool, the first electrical wire being connected to the AC transformer, the second electrical wire being connected to the doorbell;
measuring, using a current sensor, a current between the first and second electrical wires;
determining whether the circuit includes a diode based on the current and voltage;
determining whether a doorbell camera can operate with the AC transformer and the doorbell based on the voltage, current, whether the circuit includes the diode, and one or more operating parameters of the doorbell camera; and
generating, using an indicator, a visual or audible signal based on whether the doorbell camera can operate with the AC transformer and the doorbell.

10. The method of claim 9,
further comprising: determining whether the AC transformer meets the operating parameters of the doorbell camera, whether the first electrical and second electrical wires are improperly connected to the test tool whether the AC transformer does not meet the operating parameters of the device, and whether the diode is missing from the circuit.

11. The method of claim 10, further comprising:
determining whether the voltage from the AC transformer meets the voltage operating parameters of the doorbell camera, and whether the current from the AC transformer meets the current operating parameter of the doorbell camera.

12. The method of claim 10, wherein the indicator comprises:

a first indicator indicating that the voltage or current from the AC transformer meets the operating-parameters of the doorbell camera;

a second indicator indicating that the first electrical and second electrical wires are improperly connected to the test tool;

a third indicator corresponding to the third diagnostic indicating that the voltage or current from the AC transformer does not meet the operating parameters of the doorbell camera; and a fourth indicator corresponding to the fourth diagnostic indicating that the diode is missing from the circuit.

13. The method of claim 9, further comprising:

identifying the doorbell camera to be coupled to the AC transformer; and retrieving the one or more operating parameters of the identified doorbell camera.

14. The method of claim 13, further comprising:

receiving a user input identifying the doorbell camera.

15. The method of claim 9, further comprising:

identifying the doorbell camera to be coupled to the AC transformer;

querying a server for one or more operating parameters of the identified doorbell camera; and receiving the one or more operating parameters of the identified doorbell camera from the server.

16. A non-transitory computer-readable storage medium storing a set of instructions that, when executed by a processor, cause the processor to perform operations, comprising:

measuring, using a voltage sensor, a voltage between a first and a second electrical wire from a circuit formed with an alternating current (AC) transformer, a doorbell, and the test tool, the first electrical wire being connected to the AC transformer, the second electrical wire being connected to the doorbell;

measuring, using a current sensor, a current between the first and second electrical wires;

determining whether the circuit includes a diode based on the current and voltage;

determining whether a doorbell camera can operate with the AC transformer and the doorbell based on the voltage, current, whether the circuit includes the diode, and one or more operating parameters of the doorbell camera; and generating, using an indicator, a visual or audible signal based on whether the doorbell camera can operate with the AC transformer and the doorbell.

* * * * *

UNITED STATES PATENT AND TRADEMARK OFFICE
CERTIFICATE OF CORRECTION

PATENT NO. : 10,180,452 B2
APPLICATION NO. : 15/382014
DATED : January 15, 2019
INVENTOR(S) : Marin et al.

It is certified that error appears in the above-identified patent and that said Letters Patent is hereby corrected as shown below:

In the Claims

In Column 12, Line 1, in Claim 4, after "tool", insert --of--

In Column 12, Line 52, in Claim 10, after "claim 9,", delete "¶"

In Column 12, Line 53, in Claim 10, after "comprising:", insert --¶--

In Column 12, Line 56, in Claim 10, after "tool", insert --,--

In Column 13, Line 2, in Claim 12, delete "operating-parameters" and insert --operating parameters-- therefor Signed and Sealed this
Eighth Day of December, 2020

Andrei Iancu
*Director of the United States Patent and Trademark Office*